United States Patent [19]

Comer et al.

[11] 4,138,671

[45] Feb. 6, 1979

[54] SELECTABLE TRIMMING CIRCUIT FOR USE WITH A DIGITAL TO ANALOG CONVERTER

[75] Inventors: Donald T. Comer, Los Gatos; Daniel J. Dooley, Saratoga; John A. Schoeff, Los Gatos, all of Calif.

[73] Assignee: Precision Monolithics, Inc., Santa Clara, Calif.

[21] Appl. No.: 768,328

[22] Filed: Feb. 14, 1977

[51] Int. Cl.² ................................. H03K 13/02
[52] U.S. Cl. ..................... 340/347 DA; 307/241; 340/347 CC; 340/347 M
[58] Field of Search ............... 340/347 DA, 347 CC, 340/347 M; 307/299 B, 241-244

[56] References Cited

U.S. PATENT DOCUMENTS

| | | | |
|---|---|---|---|
| 3,872,323 | 3/1975 | Frederiksen et al. | 307/299 B X |
| 3,890,610 | 6/1975 | Cahen | 340/347 CC |
| 3,893,017 | 7/1975 | Williams | 307/299 B X |
| 3,940,760 | 2/1976 | Brokaw | 340/347 DA |
| 3,961,326 | 6/1976 | Craven | 340/347 DA |

OTHER PUBLICATIONS

The Engineering Staff of Analog Devices, Inc., Analog-Digital Conversion Handbook, 1972, pp. I-54 to I-63, II-40 to II-45, II-64 to II-77.
Erdi, A Precision Trim Technique for Monolithic Analog Circuits, 1975 IEEE International Solid-State Circuits Conference, pp. 192, 193, Digest of Technical Papers.
The Engineering Staff of Analog Devices, Inc., Analog-Digital Conversion Handbook, 6/1972, pp. II-61 to II-63.

*Primary Examiner*—Thomas J. Sloyan
*Attorney, Agent, or Firm*—Poms, Smith, Lande & Glenny

[57] ABSTRACT

The outputs of individual stages in a digital to analog converter are each trimmed by independent circuitry which includes a plurality of transistors connected to a common output terminal, the physical dimensions of each transistor being scaled in proportion to desired levels of current flow, and selectable switches connected in circuit with each of the transistors. Selectable switches are actuable to produce an output trimming current of a desired magnitude, which current is used to correct the untrimmed stage output. The invention includes circuitry for controlling the polarity of the trimming current relative to the stage, and for selectively expanding or contracting the trimming range to optimize the trimming currents for the particular characteristics of the converter. A favorable balance between trimming accuracy and the area occupied by the trimming circuitry is attained by the use of both emitter-scaled and multicollector transistors in the trimming circuits.

15 Claims, 5 Drawing Figures

SELECTABLE TRIMMING CIRCUIT FOR USE WITH A DIGITAL TO ANALOG CONVERTER

BACKGROUND OF THE INVENTION

1. Field of the Invention

This invention relates to electronic circuitry, and more particularly to a trimming circuit suitable for use with an integrated circuit digital to analog converter (DAC).

2. Description of the Prior Art

Most integrated circuit devices such as DAC's are manufactured initially with a certain tolerance for error, and their operating characteristics will generally differ from the nominal specifications. After manufacture the devices are tested for accuracy, and their end use determined by how close their actual operating characteristics come to the desired specifications. Frequently it is necessary to discard the device entirely because of failure to come within the required tolerance range.

Due to the difficulty in matching component values, it is common to initially manufacture a high accuracy DAC to a somewhat less stringent tolerance, and then trim at least its more important stages to the desired accuracy. In this way the operating characteristics of the device as a whole are upgraded, and some devices which might otherwise have been discarded may be retained.

In one popular trim method a laser beam is employed to physically remove portions of the bit current determining resistors, and thereby modify the values of the bit currents.

Another technique employs a set of parallel connected resistors for each stage to be trimmed. One side of the resistors of each set are connected to a voltage source and the other side to the converter stage, such that a trimming current having a magnitude determined by the overall resistance of the parallel resistance network is added to the stage outputs. The resistance values of the individual resistors for each set are weighted such that a plurality of discrete trimming levels can be achieved, depending upon which resistors are included in the circuit. For this purpose each resistor is connected in series with a switch which allows it to be either included or removed from its associated trimming circuit. Various switching devices may be used, so long as they are capable of being controlled independently. One approach provides metal links in series with each resistor, and employs a laser to cut the links of those resistors which are to be removed from the trimming circuit.

Although the individual stage accuracies can be considerably enhanced with the use of resistive trimming circuits, this type of trimming is not ideally suited for use with integrated circuits. The resistors take up relatively large areas on the surface of the circuit chip, and are themselves subject to manufacturing inaccuracies which can introduce errors into the stage output even after trimming. Since it cannot be known before manufacture whether a particular stage will require positive or negative trimming, provision for both polarities has to be made. Also the laser equipment required to implement the above schemes is relatively large and expensive.

Accordingly, while presently available trimming arrangements do improve DAC accuracy and yield, there is still considerable room for improvement.

SUMMARY OF THE INVENTION

In view of the above problems associated with the prior art, the principal object of the present invention is the provision of a novel and improved mechanism for providing a highly accurate signal, the magnitude of which is selectable, which can be used to trim a DAC stage.

Another object is the provision of such a trimming device in which the need for a redundant circuit is eliminated by providing a capability for selectively producing both positive and negative trimming signals.

An additional object is the provision of such a trimming device in the form of an integrated circuit which is compatible with and subject to control by shorting zener diode technology (sometimes referred to as avalanche-metal migration technology).

These and other objects are achieved by the use of a selectable current source for each stage of a DAC for which trimming is desired, which source includes a plurality of transistors connected to a common output terminal. The physical dimensions of each transistor are scaled in proportion to desired levels of current flow. Selectable switch means, preferably shorting zener diodes, are connected in circuit respectively with each of the transistors to enable a current flow through their associated transsistors upon receipt of an actuating signal from an actuating means. Each of the transistor-switch circuits is adapted to receive a supply voltage sufficient to establish a desired current flow when the switch means is actuated, whereby a desired level of output trimming current is attained at the common output terminal by accumulating the current flows through each of the selected transistors.

In a preferred embodiment, some of the current source transistors comprise relatively large area and high accuracy emitter-scaled constructions, while the remaining transistors comprise relatively small area multicollector constructions. The multicollector transistors are characterized by a progressively decreasing current splitting accuracy among their respective collectors as the differential between the currents in each collector increases, and have some of their collectors unconnected to the common output terminal to achieve current weighting. By scaling the emitter-scaled transistors to produce relatively high current magnitudes and scaling the multicollector transistors to produce relatively low current magnitudes, an optimum balance can be reached between chip area and accuracy.

Each of the trim current sources preferably employs a reference transistor to establish a common reference current, with the other transistors in the circuit mirroring a predetermined proportion of the reference current. Additional circuitry is included for adjusting the reference current level for each source, and thereby determining each source's output current range. The adjustment circuit includes a first transistor connected to support an auxiliary reference current, a plurality of parallel connected transistors proportionately mirroring the first transistor, and selectable switch means connected in circuit with at least some of the parallel connected transistors. The auxiliary reference current preferrably comprises the remainder current of the DAC's R-2R ladder.

Another feature deals with a circuit for selectably controlling the direction of each trimming current relative to its associated DAC stage. According to this feature, a two-branch differential stage is connected to receive the trim source output current and provides a control circuit for a current sink which, when actuated, draws output current from the converter stage toward the source. When the sink is disabled by the differential stage, the output current is reversed and directed away from the source toward the DAC stage.

DESCRIPTION OF THE DRAWINGS

Further advantages and features of the invention will be apparent to those skilled in the art from the ensuing detailed description thereof, taken together with the accompanying drawings, in which.

DETAILED DESCRIPTION OF PREFERRED EMBODIMENTS

Figure 1:
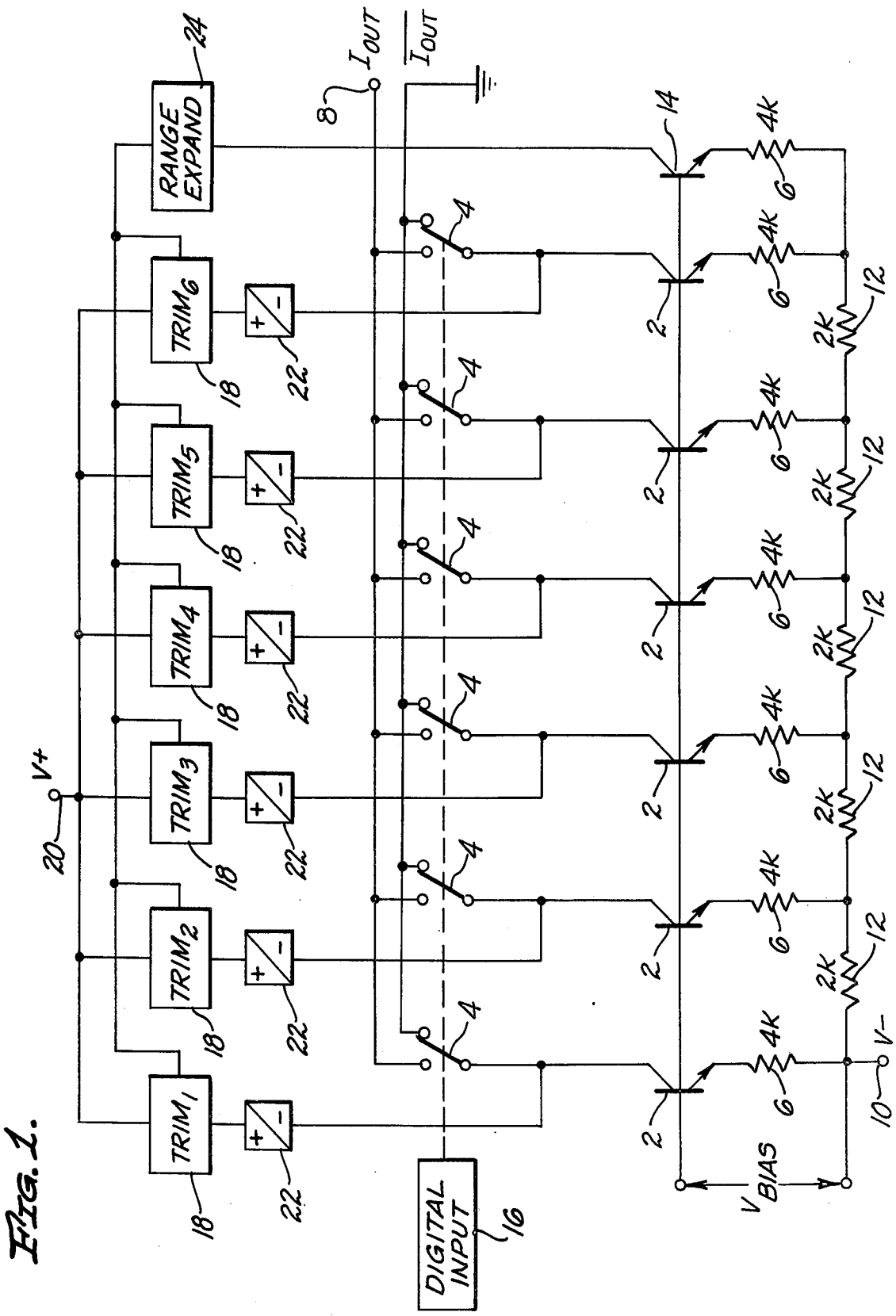
FIG. 1 is a block diagram of a digital to analog converter in which trimming sources are employed in conjunction with each of the DAC stages.

The general arrangement of the present invention as employed in conjunction with a six-stage DAC is illustrated in block diagram form in FIG. 1. The DAC employs a resistance ladder of the familiar R-2R type, with each stage or bit comprising a common biased transistor 2, a switch 4, and a 2R resistor of typical value 4K and labelled 6 connected in series between a common output terminal 8 for each of the stages and a negative voltage supply bus 10, with R resistors of typical value 2K and labelled 12 separating the various stages. With switches 4 closed, the stage currents are binarily related, the left-most stage carrying the largest current and each succeeding stage toward the right carrying a progressively smaller current. A remainder stage 14, which is not connected to output terminal 8, is provided at the end of the transistor bias line to support a current equal to that of the least significant bit and thereby balance the system. Coded digital signals are directed by a digital input means 16 to the individual stage switches 4 such that an appropriate combination of switches are closed to produce an analog output at terminal 8 corresponding to the digital input.

The general configuration of a trimming circuit constructed in accordance with the present invention is shown in the upper portion of FIG. 1. Six trimming circuits 18, labeled $TRIM_1$ through $TRIM_6$, provide corrective currents respectively for each of the six stages. The trimming circuits are connected to a common positive supply voltage bus 20 which carries a supply voltage, preferably about 15 volts, sufficient to establish desired trimming current levels. Each of the trimming circuits is connected to its respective DAC stage through a direction control circuit 22, which selectively determines whether the trimming current for the stage will be added to or subtracted from the stage output. In addition, since the trimming current levels required by the various stages are not known until after they have been manufactured, a range expand circuit 24 is connected in common to each of the trimming modules to expand or contract the range of the available trimming currents as required. For example, if the DAC's trimmed stages turn out to be relatively accurate, the trimming range would be contracted to achieve very precise trimming currents and a correspondingly high resolution. On the other hand, should these stages turn out to be relatively inaccurate, the trimming range would be expanded by an amount sufficient to preserve the DAC as a relatively low accuracy but still usable product.

Although six stages are shown in FIG. 1 with each stage trimmed, the invention is limited neither to a six-stage device nor to a device in which all the stages are trimmed. In fact, since the accuracy requirement increases with the number of stages, the principles of the invention become even more important as the number of stages increases. If more stages need to be trimmed, additional trimming circuits 18 can be added. On the other hand, in many cases only those stages which produce the largest output currents will need to be trimmed, and for these situations few trimming circuits would be necessary. In a twelve-stage DAC, for example, sufficient accuracy for most applications can be attained by trimming only the six highest order stages.

Figure 2:
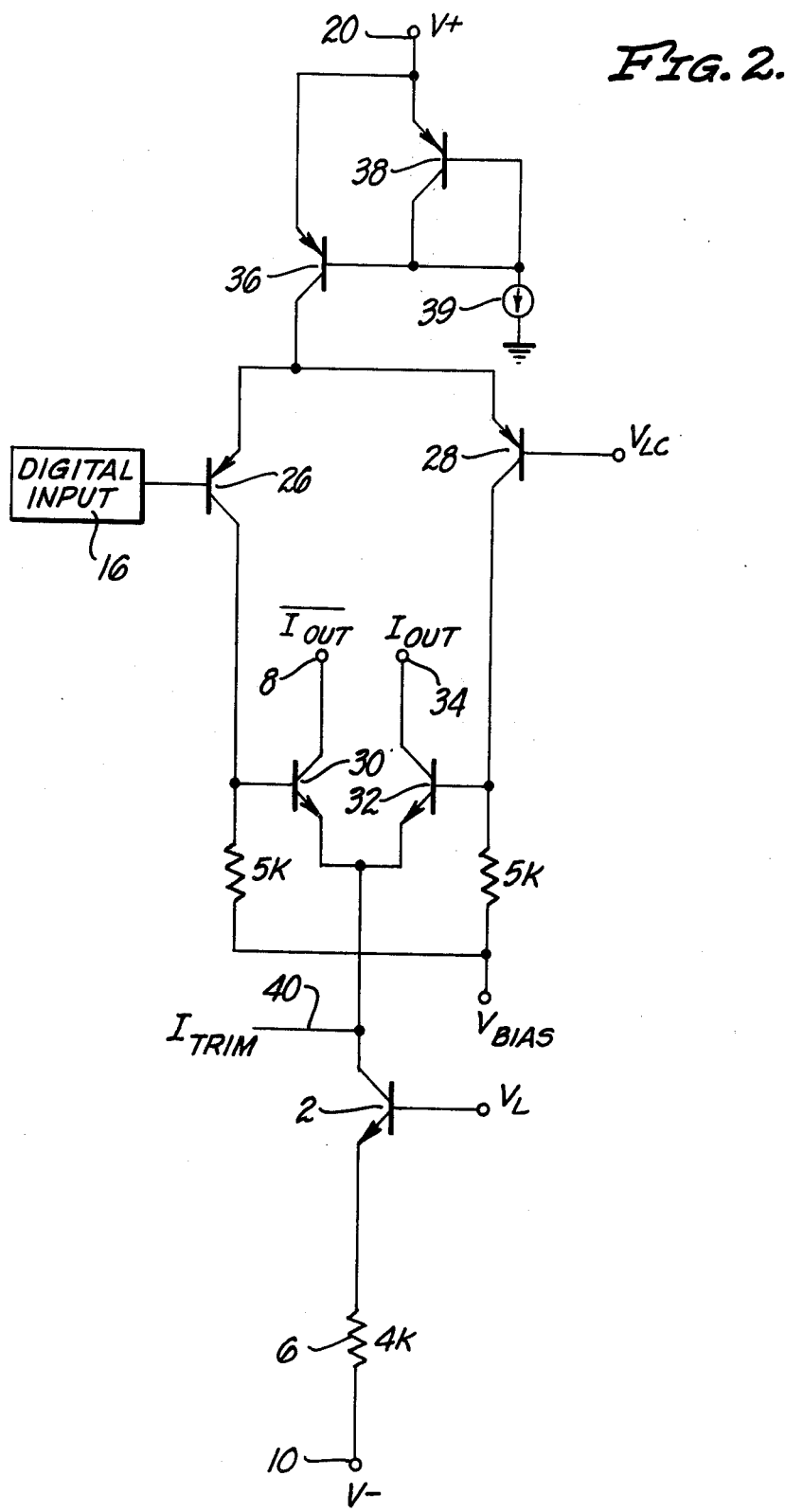
FIG. 2 is a schematic diagram of one of the DAC stages.

A typical DAC stage is shown in FIG. 2, which is biased by voltage and current levels common to the other similar stages. Switch 4 comprises a pair of differential stages, the first differential stage 26-28 is supplied with a constant current from positive supply voltage bus 20 through current source transistor 36, which is maintained at a constant bias current level by transistor 38 and bias current source 39. The emitters of second differential stage transistors 30 and 32 are connected in series circuit with stage transistor 2, ladder resistor 6, and negative supply voltage bus 10. A constant bias voltage $V_L$ for transistor 2 is also shown.

Corrective trimming current is supplied from the trimming circuit along line 40, which enters the DAC stage between the second differential stage and transistor 2. With output transistor 30 gated on, so that the stage produces an output, the current to output terminal 8 is supplied by the sum of the current through transistor 2 and the trimming current. If the untrimmed current through output terminal 8 is found to exceed the desired amount, trimming current is directed toward the collector of transistor 2 to reduce the output current by a corresponding amount. On the other hand, if the untrimmed current through output terminal 8 is insufficient, trimming current is directed away from the collector of transistor 2 to increase the output current to a level greater than that of transistor 2.

Figure 3:
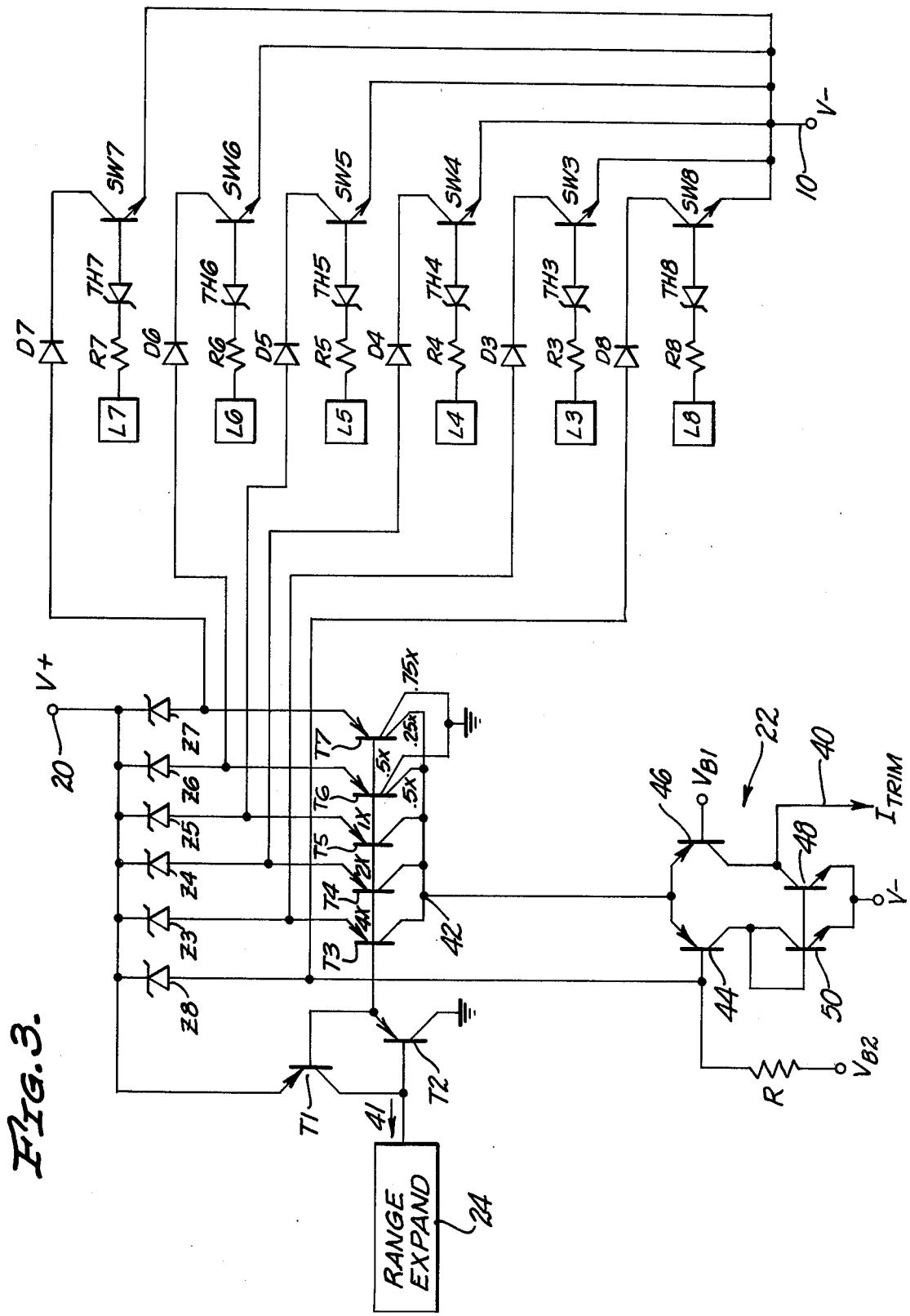
FIG. 3 is a schematic diagram of the novel trimming circuit provided by the present invention.

Referring now to FIG. 3, details of the first trimming circuit $TRIM_1$ shown as a circuit block in FIG. 1 are given. The circuit includes a common reference transistor $T_1$, a bias transistor $T_2$ controlled by a current 41 from range expand circuit 24 to apply an accurate bias to $T_1$, and a plurality of selectable current source transistors $T_3$-$T_7$. The bases of these last transistors are connected in common with the base of $T_1$ such that they proportionately mirror the current through $T_1$ and thus the current 41. Transistors $T_3$-$T_7$ are each of the PNP type, with their emitters connected to positive supply bus 20 through zener diodes $Z_3$-$Z_7$, respectively. Their collectors are connected to a common output terminal 42, which in turn is connected to direction control circuit 22. Transistors $T_3$-$T_7$ are each constructed to support individual current levels when a circuit is completed between the transistors and bus 20. The current levels of the various transistors are binarily related in the preferred embodiment, with $T_3$ contributing the greatest current to output terminal 42 and $T_7$ the least.

In the circuit shown, the emitter dimensions of $T_3$, $T_4$, and $T_5$ are scaled to achieve the desired binary relationship. $T_6$ and $T_7$ have the same emitter scaling as $T_5$ but are each provided with split collectors, only one of which is connected to output terminal 42 in a continuation of the binary relationship, with the other collectors grounded. This mixture of emitter and collector scaling is an advantage offered by the present invention, and permits this achievement of an efficient balance between the chip area devoted to the trimming circuit on one hand, and the accuracy of the trimming signals on the other hand. In general, emitter scaling is highly accurate but requires relatively large chip areas, while collector scaling requires less area but is characterized by a progressively decreasing current splitting accuracy among the collectors as the differential between the currents in each collector increases. For current differentials of more than four or five to one, the accuracy of multiple collector transistors may be unacceptable. Accordingly, emitter scaled transistors $T_3$, $T_4$ and $T_5$ are scaled to produce higher current magnitudes at which accuracy is more important, while multicollector transistors $T_6$ and $T_7$ have their collectors scaled to deliver relatively low magnitude currents to output terminal 42. The collector scaling of transistors $T_6$ and $T_7$ are indicated in the figure. A greater proportion of multi-collector transistors could be used if less trimming accuracy is required and the preservation of chip surface area is paramount, while proportionately more emitter scaled transistors could be used if the reverse conditions were true.

Current flow through each of transistors $T_3$-$T_7$ is inhibited by their respective zener diode switches $Z_3$-$Z_7$ until voltage differentials exceeding the zener breakdown voltages are applied to produce permanent short circuits. A simplified circuit for breaking down selected zeners by applying the positive supply voltage to the zener output terminals and the negative supply voltage to the zener input terminals shown in FIG. 3. The zener output terminals are shown as being connected directly to the positive supply bus 20, while each of the zener input terminals is connected to negative supply bus 10 through switching circuits which include isolating diodes $D_3$-$D_7$ and switching transistors $SW_3$-$SW_7$. The switching transistors may conveniently be controlled by gating circuits comprising DAC lead terminals $L_3$-$L_7$, current limiting resistors $R_3$-$R_7$, and threshold diodes $TH_3$-$TH_7$ which transmit gating signals to their associated switching transistors $SW_3$-$SW_7$ only when the signals at their respective leads $L_3$-$L_7$ exceed their threshold levels. With this circuit leads $L_3$-$L_7$ serve a dual role: they transmit digital input signals to the DAC stages at voltages less than the threshold level of $TH_3$-$TH_7$, and at voltages greater than the threshold voltage they gate switches $SW_3$-$SW_7$ to establish desired trimming currents. While not essential to an understanding of the present invention, further details of the preferred arrangement for breaking down the zener diodes, including selectable switches between positive voltage supply bus 20 and the zener output terminals, are provided in copending patent application Ser. No. 768,327, entitled "Trimming Control Circuit", filed on the same date and assigned to the same assignee as the present application.

Trimming output terminal 42 is connected to direction control circuit 22, which includes a differential stage comprising transistors 44 and 46. Transistor 44 is gated by breaking down and permanently shorting zener diode $Z_8$, via a circuit similar to the breakdown circuits for $Z_3$-$Z_7$, to connect its base with positive voltage supply bus 20. Transistor 46 is biased at a constant voltage $V_{B1}$, which is normally about one diode level higher than the base voltage of transistor 44 established by bias voltage $V_{B2}$. With this bias arrangement transistor 46 is cut off and substantially all of the trimming current is transmitted through transistor 44. The collector of transistor 46 is connected to the associated DAC stage, and also to the collector of an NPN transistor 48. The collector of transistor 44 is connected to a diode-connected transistor 50, the base of which is connected in common with the base of transistor 48.

In operation, transistor 48 when active functions as a current sink to draw trimming current away from the DAC stage over line 40, while transistor 46 provides a path for bypassing the current sink and delivering trimming current over line 40 away from direction control circuit 22 and toward the DAC stage. Assuming first that $Z_8$ is not shorted, the base voltage of transistor 44 will be less than that of transistor 46. This causes the trimming current from terminal 42 to flow through transistors 44 and 50, increasing the voltage at the base/collector of transistor 50 to gate transistor 48, which transistor mirrors the current through transistor 50 to draw an equal trimming current from the DAC stage over line 40. Assuming now that a voltage is applied to $L_8$ sufficient to short zener $Z_8$, the base voltage of transistor 44 will go up sufficiently to turn off both that transistor and transistor 50, thereby disabling current sink transistor 48 and gating transistor 46. In this mode trimming current bypasses the sink and instead is transmitted through transistor 46 and over line 40 towards the DAC stage. The direction of trimming current delivered over line 40 is thereby controlled by the condition of zener $Z_8$.

Figure 4:
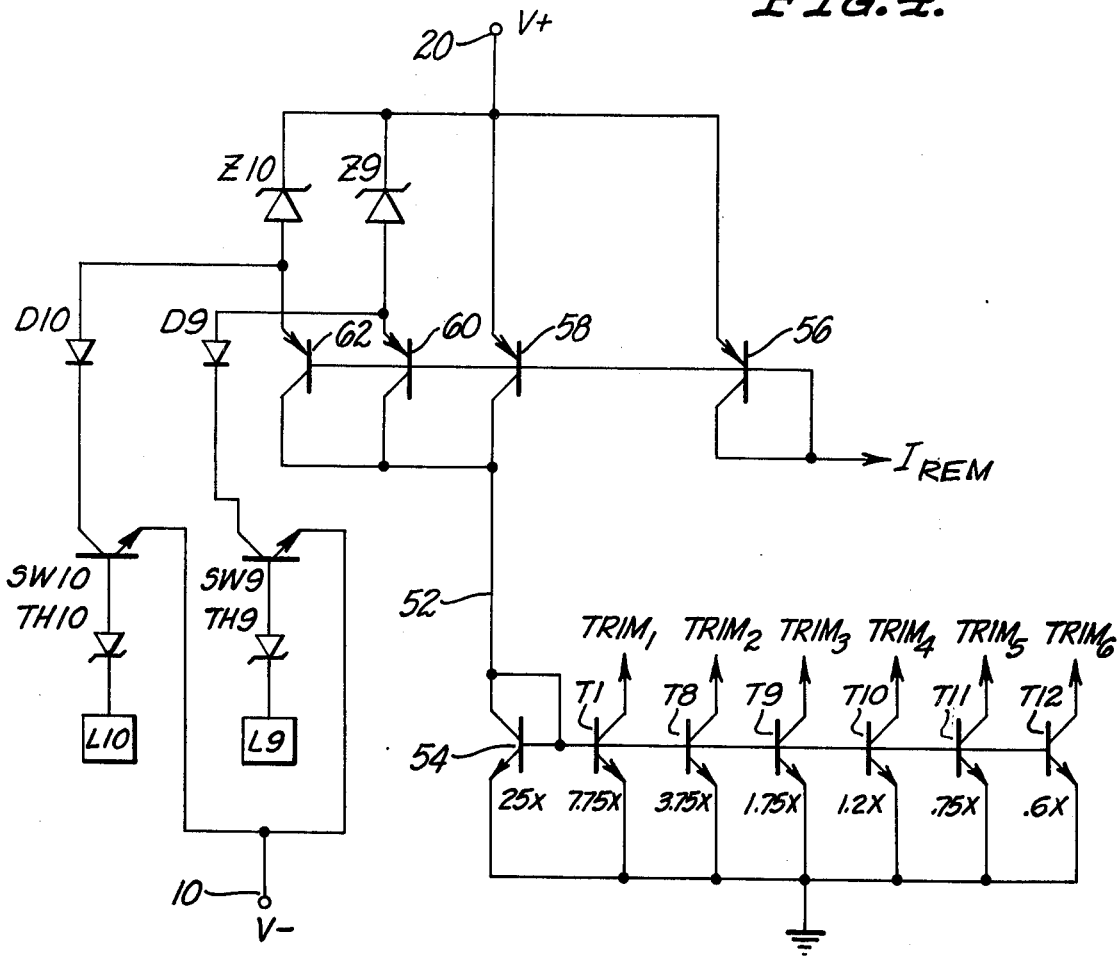
FIG. 4 is a schematic diagram of a circuit for selectably expanding the range of the trimming circuits.

The current through reference transistor $T_1$ of the first trimming circuit is controlled and related to the DAC stage currents by range expand circuit 24, shown in detail in FIG. 4. A common reference current for each of the trimming circuits is established by the range expand circuit over line 52, through a scaled diode-connected transistor 54, to ground. Transistor 54 provides a reference for current mirror transistor $T_1$ of the first trimming circuit, and also for corresponding current mirror transistors $T_8$-$T_{12}$ of the other trim circuits $TRIM_2$-$TRIM_6$. $T_1$ and $T_8$-$T_{12}$ are each NPN transistors with their emitters scaled to optimize error correction currents for each DAC stage. It will be noted that the relative scaling is not precisely a binary relationship, since the DAC stage errors are not directly proportional to the weighting of the stages. The common reference current for each of the trim circuits carried by line 52 is established by a range expand circuit comprising common-biased PNP transistors 56, 58, 60 and 62. The emitter of transistor 56 is connected to positive supply voltage bus 20, and the transistor is diode-connected with its base/collector connected to the DAC remainder current stage to provide a control current equal to the current of the least significant DAC bit. The current through transistor 56 serves as an auxiliary reference current which is proportionately mirrored by transistors 58, 60, and 62. The collectors of the latter three transistors are connected in common to line 52, with the emitter of transistor 58 connected directly to positive supply bus 20 and the emitters of transistors 60 and 62 connected to bus 20 through zener diodes $Z_9$ and $Z_{10}$, respectively. Circuits are provided for breaking down and permanently shorting zeners $Z_9$ and $Z_{10}$, similar to the breakdown circuits of zeners $Z_3$-$Z_8$, with leads $L_9$ and $L_{10}$ employed in receiving signals to actuate the breakdown circuits. Depending upon the condition of zeners $Z_9$ and $Z_{10}$, the reference current over line 52 will be equal to the current through transistor 58 alone, or to the total of the currents through transistor 58 and a combination of transistors 60 and 62. Four different common reference currents are thus possible with the circuit shown, and additional reference currents could of course be achieved by including additional transistor/switch combinations in the range expand circuit. This arrangement offers a significant advantage in that the DAC can be tested for accuracy after manufacture is completed, and the magnitude of the reference current for the trimming circuits determined accordingly. For example, if the DAC turns out to be relatively accurate, neither $Z_9$ nor $Z_{10}$ would be actuated and the only current over line 52 would come from transistor 58. This reduces the trimming range for each trim circuit and correspondingly increases the attainable resolution. If the DAC is a low accuracy device, one or both of zeners $Z_9$ and $Z_{10}$ can be actuated to increase the common reference current, thereby increasing the trimming range but lowering the resolution. The net result is that high volume production of a DAC can be used to satisfy both high and low accuracy markets, with the trimming range for each individual DAC established after manufacture in response to its measured accuracy. This offers a considerable cost reduction over the setting up of two separate production lines.

In operation, the DAC would be completely manufactured, its accuracy tested, and the output of range expand circuit 24 selected accordingly. The output of each individual trim circuit would then be selected within this range in accordance with the accuracy of each individual DAC stage. For example, for the first trim circuit shown in FIG. 3, that combination of zener diodes $Z_3$-$Z_7$ which produces an output trim current closest to the absolute stage error would be actuated by applying appropriate zener breakdown signals to leads $L_3$-$L_7$. The direction of the trimming current relative to the stage would then be determined by either breaking down and thus shorting $Z_8$ or leaving it intact, depending upon whether the trim current is to be subtracted from or added to the stage current in arriving at the corrected output for the stage.

With the scaling of transistors $T_1$ and $T_8$-$T_{12}$ progressively decreasing as shown to provide progressively smaller reference currents, the scaling for each of the selectable transistors within the various trim circuits would be related to the reference transistor for that circuit in a manner similar to the scaling between $T_1$ and $T_3$-$T_7$ shown in FIG. 3. However, there is no requirement that the various trimming circuits have identical construction. Making all the trim circuits identical would in fact be undesirable when the trimming resolutions required for the less significant stages are less, relative to their respective stage currents, than for the more significant stages. Accordingly, it should be understood that the relative scaling between the reference and mirror transistors for each trim circuit can be altered from that shown in FIG. 3, with a corresponding alteration made in the relative scaling of transistors $T_1$ and $T_8$-$T_{12}$ from that shown in FIG. 4 in order to preserve the optimum trimming range for each circuit.

Figure 5:
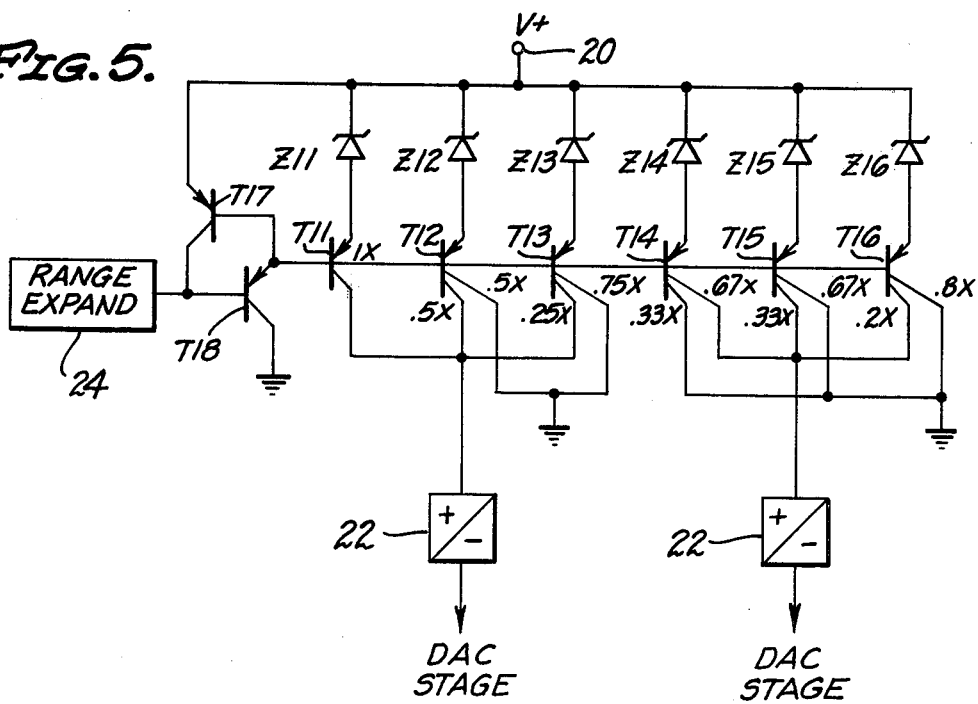
FIG. 5 is a schematic diagram of another trimming circuit embodiment.

Another embodiment of a trimming circuit, which uses fewer leads but cannot produce as precise a trimming current as the module previously described, is shown in FIG. 5. In this embodiment two trim circuits are combined in one series of selectable transistors $T_{11}$-$T_{16}$, each transistor being connected through associated zener diodes $Z_{11}$-$Z_{16}$, respectively, to positive voltage supply bus 20. Transistors $T_{11}$, $T_{12}$, and $T_{13}$ are allocated to one trim circuit, and transistors $T_{14}$, $T_{15}$, and $T_{16}$ to a second trim circuit. $T_{11}$ is emitter scaled, while the remaining transistors are collector scaled. The output of each trim circuit is connected to a corresponding direction control circuit 22, and from there to its associated DAC stage. Transistors $T_{17}$ and $T_{18}$ interface between the trim circuits and range expand circuit 24 to provide a reference current which is proportionately mirrored by $T_{11}$-$T_{16}$. Separate selectably shortable zener diode circuits (not shown) are provided to regulate direction control circuits 22. This type of arrangement would normally be employed in connection with those DAC stages which carry a lesser output current, and accordingly require a relatively lesser degree of resolution.

While particular embodiments of the invention have been shown and described, numerous additional modifications and variations are possible in light of the above teachings. It is therefore intended that the scope of the invention be limited only in and by the terms of the appended claims.

What is claimed is:

1. In a digital-to-analog signal converter comprising a plurality of stages each adapted to produce a predetermined output signal within a given tolerance range, and means responsive to an input digital signal for combining the outputs from selected ones of said stages to produce a converter output signal the magnitude of which is representative of the input binary signal, wherein the improvement comprises:

for each of at least some of said stages, a plurality of selectable transistor means external to said stage and adapted to be coupled with a voltage supply for producing a corrective trim signal, means for permanently selecting individual ones of said transistors for inclusion in the production of said trim signal irrespective of changes in the voltage supply, the pattern of selected transistors determining the magnitude of said trim signals, and means for combining the stage signal with its respective trim signal to produce a corrected stage output signal, means for establishing a common reference current, and proportional current mirror means associated with each of said trim signal producing means, each of said current mirror means mirroring a proportion of said common reference current to provide an individual reference current for its associated trim signal producing means, the magnitude of said individual reference currents being in mutual non-binary relationship, and the proportion for each trim signal producing means being selected in proportion to the relative error tolerance of its associated stage.

2. The converter of claim 1, wherein said common reference current means includes means for permanently adjusting the magnitude of said reference current, thereby enabling the production of high resolution converters from relatively accurate untrimmed converters by the selection of a relatively small common reference current, while also enabling a greater trimming range for converters with a relatively lower untrimmed accuracy by the selection of a relatively larger common reference current.

3. The converter of claim 1, said converter including a remainder current circuit connected to said common reference current means to provide a base for said common reference current.

4. The converter of claim 1, wherein the trim signal producing means for each trimmed stage comprises the combination of a plurality of permanently selectable current sources, and means for summing the currents from selected ones of said sources to yield said trim signal.

5. The converter of claim 4, wherein the magnitudes of the current source outputs of said trimmed stages are binarily related.

6. The converter of claim 4, and further including means for establishing an individual reference current for the trim signal producing means for each stage, the magnitude of reference current for each stage being established in proportion to the relative error tolerance of said stage and in non-binary relationship to the reference currents for the other stages, the current sources for each stage comprising means proportionately mirroring the reference current for that stage.

7. The converter of claim 1, and further including means connected to the output of said stages for permanently and electably controlling the direction of the trim signals for said stages.

8. In an integrated circuit digital-to-analog signal converter comprising a plurality of stages each connected to a converter output terminal, each stage including a current source-connected transistor and a switch means connected in circuit with said transistor, each of said transistors being contructed to provide a predetermined current magnitude within a given tolerance range, each of said switch means being controlled by an input digital signal to switch its respective transistor with respect to said output terminal such that the total current delivered to said terminal from said stages is representative of the input digital signal, wherein the improvement comprises:
 a) a plurality of trim circuits associated respectively with at least some of said stages, each of said trim circuits comprising:
  (1) a plurality of transistors adapted to receive a supply voltage and connected to a common trim output terminal, the physical dimensions of each of said transistors being scaled in proportion to a desired level of current flow for each transistor, said trim terminal being connected to provide trimming current to its associated converter stage,
  (2) selectable switch means connected in circuit with each of said transistors for enabling current flow through selected ones of said transistors,
  (3) means for transmitting actuating signals to permanently actuate selected ones of said switch means irrespective of changes in the supply voltage,
  (4) each of said transistor-switch circuits being adpated to receive a supply voltage sufficient to establish a desired current flow through its transistor when its associated switch means is actuated, whereby a permanent desired level of corrective trimming current may be attained at each trim output terminal by accumulating the current flows through its associated selected transistors, and
  (5) means for combining the output current of each trimmed stage with its respective trimming current to produce a permanently corrected output current for said stage,
 (b) means for establishing a common reference current, and
 (c) proportional current mirror means associated with each of said trim circuits,
 (d) each of said current mirror means mirroring a proportion of said common reference current to provide an individual reference current for its associated trim circuit, the magnitude of said individual reference currents being in mutual non-binary relationship, and the proportion for each trim circuit being selected in proportion to the relative error tolerance of its associated stage.

9. The converter of claim 8, the physical dimensions of the transistors for each trim circuit being scaled to produce a binary relationship among the magnitudes of their respective current flows.

10. The converter of claim 8, wherein some of the transistors of each trim circuit comprise relatively large area and high accuracy emitter-scaled constructions, and the remainder of the transistors of each trim circuit comprise relatively small area multicollector constructions having some of their collectors unconnected to said common output terminal, the latter transistors being characterized by a progessively decreasing current splitting accuracy among their respective collectors as the differential between the currents in each collector increases.

11. The converter of claim 10, wherein said emitter-scaled transistors are scaled to produce relatively high current magnitudes, and said multicollector transistors are scaled to produce relatively low current magnitudes at said common output terminal.

12. The converter of claim 8, said converter including a ladder remainder current circuit, said circuit being connected to provide said common reference current.

13. The converter of claim 8, and further including means for permanently adjusting the level of said common reference current, and thereby enabling the production of high resolution converters from relatively accurate untrimmed converters by the selection of a relatively small common reference current, while also enabling a greater trimming range for converters with a relatively lower untrimmed accuracy by the selection of a relatively larger common reference current.

14. The converter of claim 13, wherein said means for permanently adjusting the common reference current includes a first transistor connected to support an auxiliary reference current, a plurality of parallel connected transistors mirroring said first transistor to pass currents the magnitudes of which are substantially fixed proportions of said auxiliary reference current, and permanently selectable switch means connected in circuit with at least some of said parallel connected transistors for controlling the current flow therethrough, said parallel transistor currents being accumulated to provide said common reference current.

15. In an integrated circuit digital-to-analog signal converter comprising a plurality of stages each connected to a converter output terminal, each stage including a current source-connected transistor and a switch means connected in circuit with said transistor, each of said transistors being constructed to provide a predetermined current magnitude within a given tolerance range, each of said switch means being controlled by an input digital signal to switch its respective transistor with respect to said output terminal such that the total current delivered to said terminal from said stages is representative of the input digital signal, wherein the improvement comprises a plurality of trim circuits associated respectively with at least some of said stages, each of said trim circuits comprising:

a plurality of transistors adapted to be coupled with a voltage supply and connected to a common trim output terminal, the physical dimensions of each of said transistors being scaled in proportion to a desired level of current flow for each transistor, said trim terminal being connected to provide trimming current to its associated converter stage, selectable switch means connected in circuit with each of said transistors for enabling current flow through selected ones of said transistors, means for transmitting actuating signals to permanently actuate selected ones of said switch means irrespective of changes in the supply voltage, each of said transistor-switch circuits being adapted to receive a supply voltage sufficient to establish a desired current flow through its transistor when its associated switch means is actuated, whereby a permanent desired level of corrective trimming current may be attained at each trim output terminal by accumulating the current flows through its associated selected transistors, means for combining the output current of each trimmed stage with its respective trimming current to produce a permanently corrected output current for said stage, means for establishing a common reference current, a plurality of proportional current mirror means each mirroring a proportion of said common reference current to provide individual reference currents for respective ones of said trim circuits, the proportion of current mirrored by each of said proportional current mirror means being determined in proportion to the relative error tolerance of its associated converter stage, and in non-binary relationship to the reference currents for the other stages, and means for permanently adjusting the level of said common reference current, and thereby enabling the production of high resolution converters from relatively accurate untrimmed converters by the selection of a relatively small common reference current, while also enabling a greater trimming range for converters with a relatively lower untrimmed accuracy by the selection of a relatively larger common reference current, said means for permanently adjusting the common reference current including a first transistor connected to support an auxiliary reference current, a plurality of parallel connected transistors mirroring said first transistor to pass currents the magnitudes of which are substantially fixed proportions of said auxiliary reference current, and permanently selectable switch means connected in circuit with at least some of said parallel connected transistors for controlling the current flow therethrough, said parallel transistor currents being accumulated to provide said common reference current, and said permanently selectable switch means comprising a plurality of zener diodes, each of said diodes being connected in series circuit with a respective one of said trim circuit transistors to block current flow through said transistor, and means for transmitting a breakdown voltage differential to selected ones of said diodes to enable current flow through their associated transistors.

* * * * *